United States Patent
Davenel et al.

(10) Patent No.: US 10,840,390 B2
(45) Date of Patent: Nov. 17, 2020

(54) LOCATING AND DETECTING DEVICE COMPRISING A PLURALITY OF PHOTODIODES

(71) Applicant: SAFRAN ELECTRONICS & DEFENSE, Boulogne-Billancourt (FR)

(72) Inventors: Arnaud Davenel, Boulogne-Billancourt (FR); Michel Jouffroy, Boulogne-Billancourt (FR); Landry Chopin, Boulogne-Billancourt (FR); Vincent Fraysse, Boulogne-Billancourt (FR)

(73) Assignee: SAFRAN ELECTRONICS & DEFENSE, Boulogne-Billancourt (FR)

( * ) Notice: Subject to any disclaimer, the term of this patent is extended or adjusted under 35 U.S.C. 154(b) by 0 days.

(21) Appl. No.: 16/649,561

(22) PCT Filed: Sep. 20, 2018

(86) PCT No.: PCT/EP2018/075509
§ 371 (c)(1),
(2) Date: Mar. 20, 2020

(87) PCT Pub. No.: WO2019/057834
PCT Pub. Date: Mar. 28, 2019

(65) Prior Publication Data
US 2020/0287063 A1  Sep. 10, 2020

(30) Foreign Application Priority Data
Sep. 21, 2017 (FR) .................................... 17 00968

(51) Int. Cl.
*H01L 31/00* (2006.01)
*H01L 31/02* (2006.01)
*H04N 5/357* (2011.01)

(52) U.S. Cl.
CPC ....... *H01L 31/02024* (2013.01); *H04N 5/357* (2013.01)

(58) Field of Classification Search
CPC .................. H01L 31/02024; H04N 5/357
USPC ............................ 250/208.1; 348/295
See application file for complete search history.

(56) References Cited

U.S. PATENT DOCUMENTS

| 2012/0217386 A1 | 8/2012 | Ricci |
| 2014/0268116 A1 | 9/2014 | Fant et al. |
| 2019/0165014 A1* | 5/2019 | Wada ................ H04N 5/347 |
| 2020/0075652 A1* | 3/2020 | Chen ................ H01L 27/14621 |

FOREIGN PATENT DOCUMENTS

GB  2447264 A  9/2008

* cited by examiner

*Primary Examiner* — Kevin K Pyo
(74) *Attorney, Agent, or Firm* — Muncy, Geissler, Olds & Lowe, P.C.

(57) ABSTRACT

A detection and locating device comprising a plurality of optical sensors (Q1, Q2, Q3, Q4) having fields that together define the field of the detection and locating device, each sensor having a plurality of photodiodes having fields that together define the field of the sensor, the sensors being connected to a control unit (10) in such a manner that each sensor supplies a first signal corresponding to the sum of the signals from at least two of the photodiodes.

7 Claims, 2 Drawing Sheets

LOCATING AND DETECTING DEVICE COMPRISING A PLURALITY OF PHOTODIODES

The present invention relates to the field of optical detection, and more particularly to detecting light spots that have been reflected or emitted by objects in order to position the objects in three-dimensional space.

STATE OF THE ART

A detection and locating device is known that comprises an optical sensor having four photodiodes that provide respective signals proportional to respective received quantities of light energy and that have fields that are combined in order to form the field of the sensor. A distinction should be drawn between the total field of the sensor, which is the optical field in which a light spot can be detected by at least one of the photodiodes, and its linear field, which is the portion of the total field in which a plurality of photodiodes observe the light spot, thus enabling an angle measurement to be made. The detection and locating devices associated with a calculation circuit arranged to perform angle measurements, i.e. to determine the position of a light spot located in the linear field of the sensor by calculating a barycenter or "center of gravity" for the light spot in the linear field of the sensor from the energies detected by the photodiodes. Specifically:
  when the light spot is at the center of the field of sensor, all four photodiodes measure the same light energy, so they deliver signals having the same value (ignoring measurement noise). The barycenter as calculated thus likewise lies at the center of the linear field;
  if the spot is offset towards any one of the photodiodes, that photodiode delivers a greater signal than the other photodiodes, and the barycenter calculated for the detected spot is offset towards said photodiode.

By way of example, that type of detection and locating device is used to guide a vehicle towards a light spot coming from an object.

OBJECT OF THE INVENTION

An object of the invention is to provide means for improving the performance of such a detection and locating device.

BRIEF SUMMARY OF THE INVENTION

To this end, the invention provides a detection and locating device comprising a plurality of optical sensors having fields that together define the field of the detection and locating device, each sensor having a plurality of photodiodes having fields that together define the field of the sensor, the sensors being connected to a control unit in such a manner that each sensor supplies a first signal corresponding to the sum of the signals from at least two of the photodiodes.

When each photodiode produces a signal that is relatively weak, a stronger signal is obtained by summing the signals from a plurality of photodiodes; however the noise remains substantially the same, thereby increasing the signal-to-noise ratio.

Other characteristics and advantages of the invention appear on reading the following description of particular, nonlimiting embodiments of the invention.

BRIEF DESCRIPTION OF THE FIGURES

Reference is made to the accompanying drawings, in which.

DETAILED DESCRIPTION OF THE INVENTION

Figure 1:
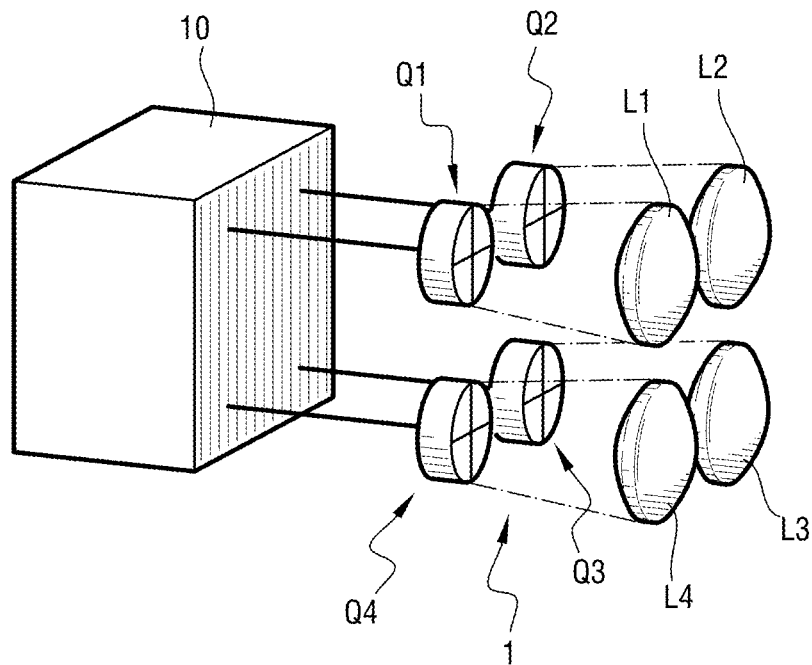
FIG. 1 is a diagrammatic perspective view of a detection and locating device of the invention.
Figure 2:
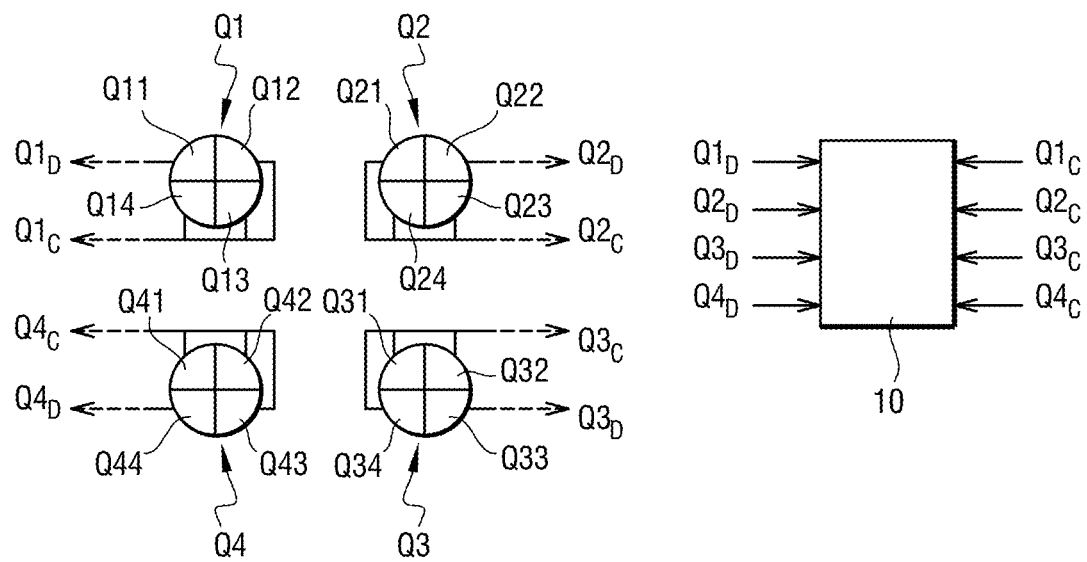
FIG. 2 is a diagrammatic view of the electronic circuit of the detection and locating device with the sensors seen in front view.

With reference to FIGS. 1 and 2, the detection and locating device 1 has four optical sensors given general references Q1, Q2, Q3, and Q4, having fields that together define the field of the detection and locating device 1, and also a control unit 10 connected to the sensors Q1, Q2, Q3, and Q4.

Each optical channel includes one of the sensors (Q1, Q2, Q3, or Q4) itself comprising four photodiodes arranged in quadrants (and each symbolized in the figures in the form of a quarter of a disk for greater clarity) and an optical group defining the field of each optical channel that is combined with the fields of the other optical channels from the same sensor in order to define the field of the sensor in question. In this example, the optical groups are symbolized L1, L2, L3, and L4. In this example, the photodiodes are mono photodiodes and they are referenced Qi1, Qi2, Qi3, and Qi4, where i corresponds to the number of the sensor.

Three of the photodiodes of each sensor Q1, Q2, Q3, and Q4 are connected to a single connector line Q1$c$, Q2$c$, Q3$c$, or Q4$c$, itself connected to a control unit 10, and the remaining photodiode of each sensor Q1, Q2, Q3, and Q4 is connected to the control unit 10 directly by a respective line Q1$d$, Q2$d$, Q3$d$, or Q4$d$.

It should be observed that the photodiode connected directly to the control unit 10 is not the same for the four sensors Q1, Q2, Q3, and Q4.
  More precisely in this example:
  the photodiodes Q12, Q13, and Q14 are connected to the collector line Q1$c$;
  the photodiodes Q21, Q23, and Q24 are connected to the collector line Q2$c$;
  the photodiodes Q31, Q32, and Q34 are connected to the collector line Q3$c$; and
  the photodiodes Q41, Q42, and Q43 are connected to the collector line Q4$c$.

Thus, each sensor Q1, Q2, Q3, and Q4 supplies the control unit 10 both with a first signal corresponding to the sum of the signals from the three photodiodes connected to the collector line Q1$c$, Q2$c$, Q3$c$, or Q4$c$, and also with a second signal corresponding to the signal from the photodiode connected to the line Q1$d$, Q2$d$, Q3$d$, or Q4$d$. The first signal is thus the analog sum of the signals from the three photodiodes connected to the collector line Q1$c$, Q2$c$, Q3$c$, or Q4$c$.

The control unit 10 comprises an electronic card including in conventional manner a processor and a memory containing a control program for the detection and locating device 1.

The control unit 10 is programmed firstly to subtract the second signal from the first signal of each sensor Q1, Q2, Q3, and Q4, and secondly to sum the first signal and the second signal of each sensor Q1, Q2, Q3, and Q4.

The signal that results from the subtraction is used for performing the angle measurement. The first and second signals are subject to identical noise, but the useful component of the second signal is smaller than the useful component of the first signal. Subtracting the second signal from the first signal thus makes it possible, in simple manner, to reduce noise without excessively reducing the useful component of the first signal.

The signal that results from summing is used to improve the signal-to-noise ratio and for performing the angle measurement.

Figure 3:
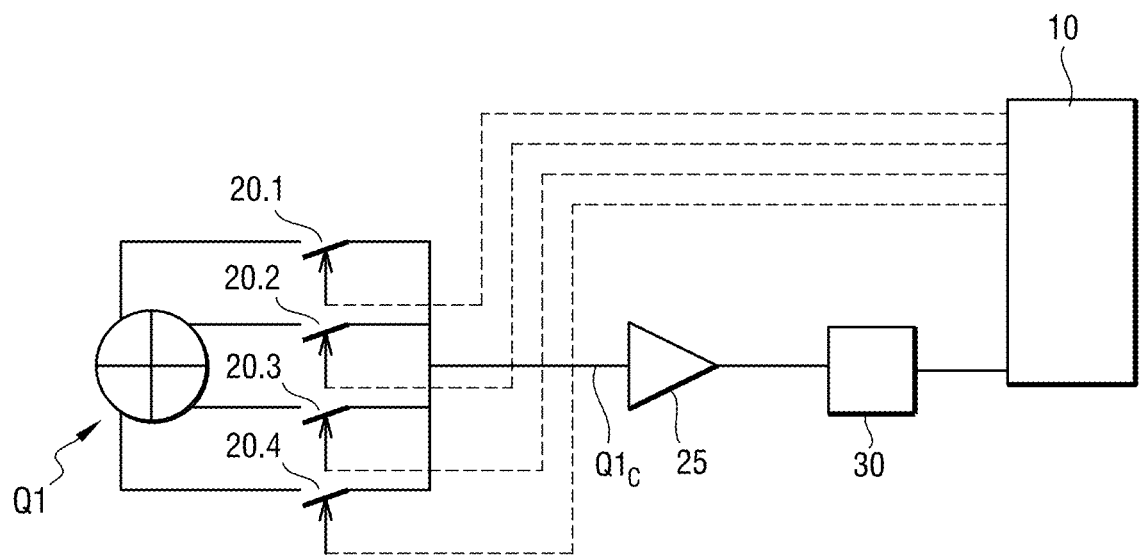
FIG. 3 is a view analogous to FIG. 2 showing only one of the sensors in a variant embodiment.

In the variant of FIG. 3, the photodiodes of each sensor Q1, Q2, Q3, and Q4 are connected together by switches 20.1, 20.2, 20.3, and 20.4 in such a manner as to be able to connect any of the photodiodes of a given sensor Q1, Q2, Q3, and Q4 together and to the collector line Q1c, Q2c, Q3c, or Q4c. Each collector line Q1c, Q2c, Q3c, and Q4c is connected to the control unit 10 via a respective amplifier 25 and a respective analog-to-digital converter 30.

The control unit 10 is arranged to change which photodiodes supply the first and second signals. More precisely, the control unit 10 is arranged to change the photodiodes periodically in a circular permutation and to filter the measurements obtained. By way of example, the filtering is averaging, which serves to eliminate errors from the signals obtained by averaging.

A circular permutation is preferably performed after a light spot (such as a laser pulse) is detected.

Thus, by way of example, the control unit 10 is programmed so that:
on a pulse p:
 the photodiodes Q12, Q13, and Q14 are connected to the collector line Q1c;
 the photodiodes Q21, Q23, and Q24 are connected to the collector line Q2c;
 the photodiodes Q31, Q32, and Q34 are connected to the collector line Q3c; and
 the photodiodes Q41, Q42, and Q43 are connected to the collector line Q4c;
on a pulse p+1:
 the photodiodes Q11, Q13, and Q14 are connected to the collector line Q1c;
 the photodiodes Q21, Q22, and Q24 are connected to the collector line Q2c;
 the photodiodes Q31, Q32, and Q33 are connected to the collector line Q3c;
 the photodiodes Q42, Q43, and Q44 are connected to the collector line Q4c; and
on a pulse p+2:
 the photodiodes Q11, Q12, and Q14 are connected to the collector line Q1c;
 the photodiodes Q21, Q22, and Q23 are connected to the collector line Q2c;
 the photodiodes Q32, Q33, and Q34 are connected to the collector line Q3c; and
 the photodiodes Q41, Q43, and Q44 are connected to the collector line Q4c; and
on a pulse p+3:
 the photodiodes Q11, Q12, and Q13 are connected to the collector line Q1c;
 the photodiodes Q22, Q23, and Q24 are connected to the collector line Q2c;
 the photodiodes Q31, Q33, and Q34 are connected to the collector line Q3c; and
 the photodiodes Q41, Q42, and Q44 are connected to the collector line Q4c.

Filtering the weightings applied during this rotating calibration serves to reduce the sensitivity errors of the sixteen photodiodes and of their electronics, as result from ageing of the photodiodes (e.g. because of oxidation) or from variation in the analog gain or in the photoelectric conversion gain (variation in the bias or in the power supply stage connected to the sensor). This is advantageous since these errors tend to vary with time or with temperature, so they cannot be corrected once and for all.

This rotating calibration can be performed while the vehicle carrying the detection and locating device is moving or else while it is stationary.

Naturally, the invention is not limited to the embodiments described and covers any variant coming within the ambit of the invention as defined by the claims.

In particular, the device may be of a structure different from that described.

In particular, the number of photodiodes may be other than four, and the photodiodes may be arranged differently. By way of example, the device may have eight photodiodes arranged in a matrix.

In a variant, in a degraded version of the first embodiment of the invention, it is possible to ignore the second signal.

It is possible to envisage filtering other than by averaging.

A respective amplifier may be connected at the output from each of the photodiodes upstream from the switches 20.1, 20.2, 20.3, and 20.4.

The summing may be performed in analog manner or in digital manner.

Under certain circumstances, it is possible to envisage that the first signal is equal to the sum of the signals from all of the photodiodes.

In a variant, the photodiodes (Qi1, Qi2, Qi3, and Qi4) that produce the first signal may be connected to one another in permanent manner.

The invention claimed is:

1. A detection and locating device comprising a plurality of optical sensors having fields that together define the field of the detection and locating device, each sensor having a plurality of photodiodes having fields that together define the field of the sensor, the sensors being connected to a control unit in such a manner that each sensor supplies a first signal corresponding to the sum of the signals from at least two of the photodiodes, the first signal corresponding to the sum of the signals from all of the photodiodes minus one, and each sensor supplies a second signal formed by the signal from the photodiode not taken into account for forming the first signal
 wherein the control unit (10) is arranged to subtract the second signal of each sensor (Q1, Q2, Q3, Q4) from its first signal.

2. The device according to claim 1, wherein the control unit is arranged to sum the first and second signals of each sensor.

3. A The device according to claim 1, wherein the photodiodes that produce the first signal are connected to one another in permanent manner.

4. A The device according to claim 1, wherein the photodiodes of each sensor are connected to one another by switches in such a manner as to be able to connect any of the photodiodes together, and the switches are connected to the control unit so as to be controlled thereby.

5. The device according to claim 4, wherein the control unit is arranged to control the switches in such a manner as to change the photodiodes that supply the first signal.

6. The device according to claim 4, wherein the control unit is arranged to change the photodiodes periodically in permutation and to filter the measurements obtained.

7. The device according to claim 1, wherein the photodiodes are four in number for each sensor.

\* \* \* \* \*